(12) United States Patent
Rainbow et al.

(10) Patent No.: US 10,742,031 B2
(45) Date of Patent: Aug. 11, 2020

(54) MODULAR POWER DISTRIBUTION ASSEMBLY

(71) Applicant: GE Aviation Systems Limited, Gloucestershire (GB)

(72) Inventors: Alexander James Rainbow, Swindon (GB); Christopher Andrew Leivers, Stroud (GB); Michael James Smith, Chadlington (GB)

(73) Assignee: GE Aviation Systems Limited, Gloucestershire (GB)

( * ) Notice: Subject to any disclaimer, the term of this patent is extended or adjusted under 35 U.S.C. 154(b) by 72 days.

(21) Appl. No.: 16/023,373

(22) Filed: Jun. 29, 2018

(65) Prior Publication Data

US 2019/0052081 A1    Feb. 14, 2019

(30) Foreign Application Priority Data

Aug. 11, 2017    (GB) .................................. 1712894.3

(51) Int. Cl.
*H01R 25/14*    (2006.01)
*H05K 7/14*    (2006.01)
(Continued)

(52) U.S. Cl.
CPC ................ *H02J 3/14* (2013.01); *B64D 31/02* (2013.01); *H01R 25/14* (2013.01); *H02B 1/041* (2013.01); *H02J 3/381* (2013.01); *H02J 4/00* (2013.01); *H05K 7/1457* (2013.01); *H01R 9/2458* (2013.01)

(58) Field of Classification Search
CPC ............................................. H01R 25/14–147
See application file for complete search history.

(56) References Cited

U.S. PATENT DOCUMENTS 5,378,552 A * 1/1995 Dixon, Jr. ............. B60L 3/0007
                                                            429/91
5,496,657 A * 3/1996 Dixon, Jr. ............. H01M 2/206
                                                            429/1
(Continued)

FOREIGN PATENT DOCUMENTS

CN    102652388 A    8/2012
CN    203339972 U    12/2013
(Continued)

OTHER PUBLICATIONS

Combined Search and Examination Report issued in related United Kingdom Patent Application No. 1712894.3, 5 pages, dated Feb. 12, 2018, The Ark, Hammersmith, London.
(Continued)

*Primary Examiner* — Robert J Hoffberg
(74) *Attorney, Agent, or Firm* — McGarry Bair, P.C.

(57) ABSTRACT

A modular power distribution assembly includes a first power module having a power input, a first aperture extending therethrough, and a first bus bar connector at the first aperture and a set of second power modules having a respective power switch, a second aperture extending therethrough, and a second bus bar connector at the aperture, wherein the first power module and the set of second power modules have an attachment interface adapted to physically secure the first power module to the set of second power modules.

20 Claims, 5 Drawing Sheets

(51) Int. Cl.
*H02B 1/04* (2006.01)
*H02J 3/14* (2006.01)
*B64D 31/02* (2006.01)
*H02J 3/38* (2006.01)
*H02J 4/00* (2006.01)
*H01R 9/24* (2006.01)

(56) References Cited

U.S. PATENT DOCUMENTS

| | | | |
|---|---|---|---|
| 5,675,194 A | 10/1997 | Domigan | |
| 6,504,730 B1 | 1/2003 | Cooney et al. | |
| 6,603,075 B1 | 8/2003 | Soares et al. | |
| 6,625,000 B2 * | 9/2003 | Jakwani | H01T 4/06 361/118 |
| 6,731,514 B2 * | 5/2004 | Evans | H05K 1/144 361/785 |
| 6,913,471 B2 | 7/2005 | Smith | |
| 7,808,775 B2 | 10/2010 | Cherney et al. | |
| 8,169,777 B2 * | 5/2012 | Huang | G06F 1/181 248/223.31 |
| 8,446,039 B2 | 5/2013 | Ziegler | |
| 8,795,001 B1 | 8/2014 | Lam et al. | |
| 9,379,468 B2 * | 6/2016 | Zieman | H01R 12/91 |
| 9,561,760 B2 | 2/2017 | Shander et al. | |
| 10,186,979 B2 | 1/2019 | Harada et al. | |
| 10,305,263 B2 * | 5/2019 | Cox | E04B 5/48 |
| 10,531,587 B2 * | 1/2020 | Compton | B64D 41/00 |
| 2019/0069430 A1 * | 2/2019 | Compton | H05K 7/1457 |
| 2019/0075675 A1 * | 3/2019 | Collins | H05K 7/1457 |
| 2019/0237947 A1 * | 8/2019 | Cox | E04B 5/48 |

FOREIGN PATENT DOCUMENTS

| | | |
|---|---|---|
| CN | 104554747 A | 4/2015 |
| CN | 205029568 U | 2/2016 |
| CN | 205356165 U | 6/2016 |
| CN | 106067736 A | 11/2016 |
| EP | 0869063 A1 | 10/1998 |
| GB | 2547946 A | 9/2017 |
| WO | 2017149301 A1 | 9/2017 |

OTHER PUBLICATIONS

Chinese Patent Office, Office Action re Corresponding Application No. 201810909772.5, dated Jun. 19, 2020, 6 pages, China.

* cited by examiner

MODULAR POWER DISTRIBUTION ASSEMBLY

BACKGROUND OF THE INVENTION

Electrical power systems, such as those found in an aircraft power distribution system, employ power generating systems or power sources, such as generators, for generating electricity for powering electrical loads, such as loads in the systems and subsystems of an aircraft. As the electricity traverses electrical bus bars to deliver power from power sources to electrical loads, power distribution nodes dispersed throughout the power system ensure that power delivered to the electrical loads meets the designed power criteria for the loads. Power distribution nodes can, for instance, further provide step-up or step-down power conversion, direct current (DC) to alternating current (AC) power conversion or AC to DC power conversion, or switching operations to selectively enable or disable the delivery of power to particular electrical loads, depending on, for example, available power distribution supply, criticality of electrical load functionality, or aircraft mode of operation, such as take-off, cruise, or ground operations.

Typical power distribution nodes include one or more rack assemblies for including, for example, a number of electronic cards to provide for the aforementioned conversions or switching functions. The rack assemblies are not typically optimized to be contained within the smallest configurable installation volume, leading to rack assemblies larger than necessary, and unused or underutilized components.

BRIEF DESCRIPTION OF THE INVENTION

In one aspect, the disclosure relates to a modular power distribution assembly including a first power module having a power input, a first aperture extending therethrough, and a first bus bar connector at the first aperture, and a set of second power modules having a respective power switch, a second aperture extending therethrough, and a second bus bar connector at the second aperture. the first power module and the set of second power modules have an attachment interface adapted to physically secure the first power module to the set of second power modules, and wherein the physically securing of first and set of second power modules align the set of first and second apertures to receive a continuous bus bar therethrough.

In another aspect, the disclosure relates to a modular power distribution apparatus includes a first end module and a second end module, at least one of the first or second end modules having at least one of an end module communication interface, a power supply, or a processor, and at least one switching module having a switching module electrical power interface configured to electrically connect to another switching module by way of a bus bar connector, and having a switching element, an input/output connector, and a switching module communication interface. The bus bar connector includes an aperture extending through the at least one switching module and adapted to receive a bus bar in a sprung connector connected with the switching element.

DESCRIPTION OF EMBODIMENTS OF THE INVENTION

Figure 1:
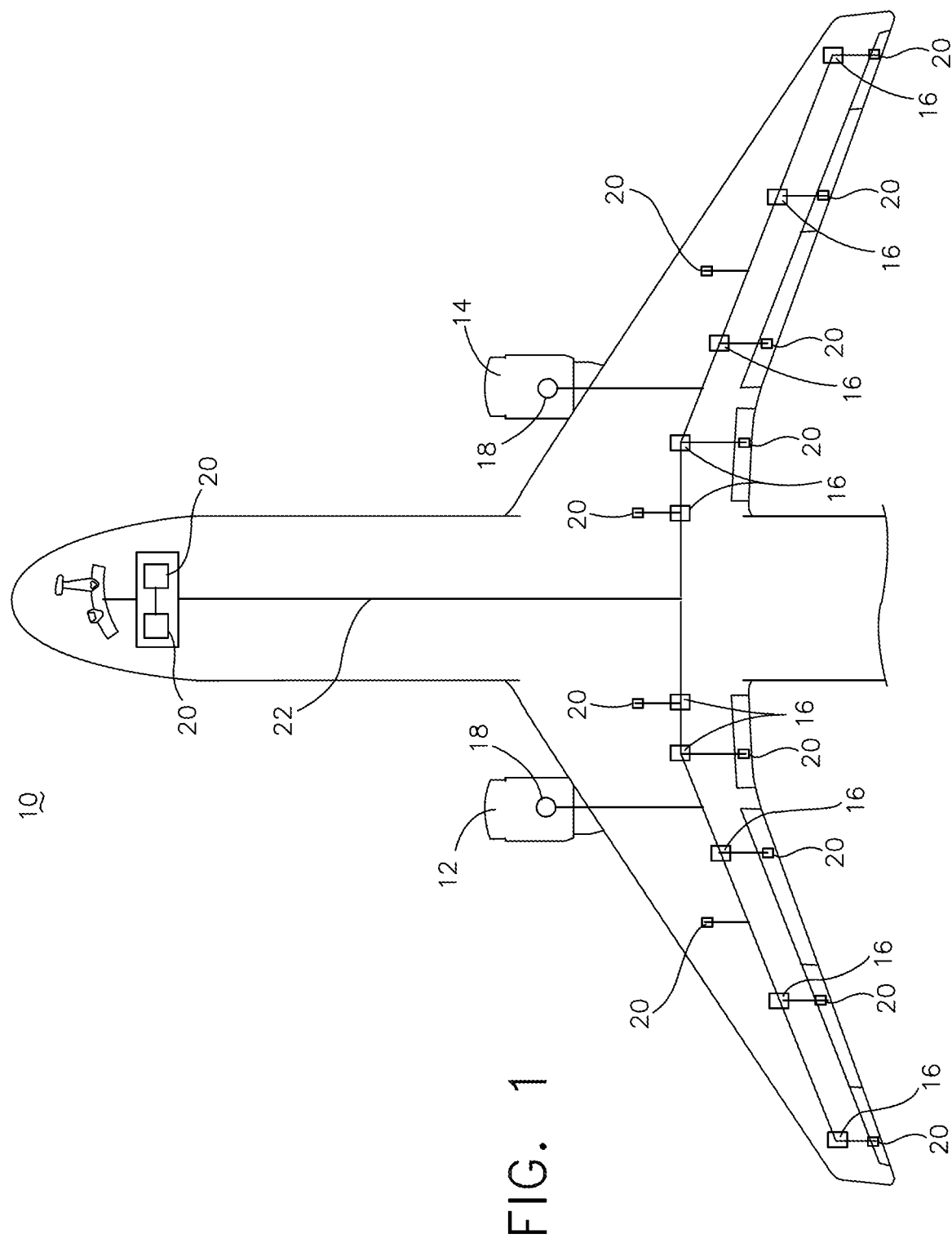
FIG. 1 is a top down schematic view of the aircraft and power distribution system of an aircraft in accordance with various aspects described herein.

The described aspects of the present disclosure are directed to a method and assembly associated with a modular power distribution assembly. One example environment where such a method and apparatus can be used includes, but is not limited to, a power distribution system for an aircraft. While this description is primarily directed toward a power distribution system for an aircraft, it is also applicable to any environment using a nodal-based power distribution system where input power is received, acted upon (if necessary), e.g., converted or modified, and distributed to one or more electrical loads.

While "a set of" various elements will be described, it will be understood that "a set" can include any number of the respective elements, including only one element. The use of the terms "proximal" or "proximate" to an element refers to a component being relatively closer to the element as compared to another component. As used herein, the terms "axial" or "axially" refer to a dimension along a longitudinal axis of a described component, such as a bus bar conductor.

Additionally, while terms such as "voltage", "current", and "power" can be used herein, it will be evident to one skilled in the art that these terms can be interchangeable when describing aspects of the electrical circuit, or circuit operations. Non-limiting example power distribution bus connections or disconnections can be enabled or operated by way of switching, bus tie logic, or any other connectors configured to enable or disable the energizing of electrical loads downstream of the bus.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

Aspects of the disclosure can be implemented in any electrical circuit environment having a switch. A non-limiting example of an electrical circuit environment that can include aspects of the disclosure can include an aircraft power system architecture, which enables production of electrical power from at least one spool of a turbine engine, preferably a gas turbine engine, and delivers the electrical power to a set of electrical loads via at least one solid state switch, such as a solid state power controller (SSPC) switching device. One non-limiting example of the SSPC can include a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included.

The exemplary drawings are for purposes of illustration only and the dimensions, positions, order and relative sizes reflected in the drawings attached hereto can vary.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as an electric machine or a generator 18. The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22 or bus bars, and power distribution nodes 16. It will be understood that the illustrated aspect of the disclosure of FIG. 1 is only one non-limiting example of a power distribution system, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the transmission lines 22, which delivers the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. The power distribution nodes 16 are shown selectively coupled with a single electrical load 20 for ease of illustration and understanding. Aspects of the disclosure can include power distribution nodes 16 that are selectively coupled with a set of electrical loads 20, wherein a power distribution node 16 can selectively enable or disable the delivery of power to individual or a subset of the electrical loads 20, as described herein. Additionally, all or a subset of the power distribution nodes 16 can be further interconnected (not shown) in order to provide redundant power supply in the event of malfunction or failure of a single node 16.

Additional management functions can be included. Furthermore, additional power sources for providing power to the electrical loads 20, such as emergency power sources, ram air turbine systems, starter/generators, or batteries, can be included, and can substitute for the power source. It will be understood that while one aspect of the disclosure is shown in an aircraft environment, the disclosure is not so limited and has general application to electrical power systems in non-aircraft applications, such as other mobile applications and non-mobile industrial, commercial, and residential applications.

Figure 2:
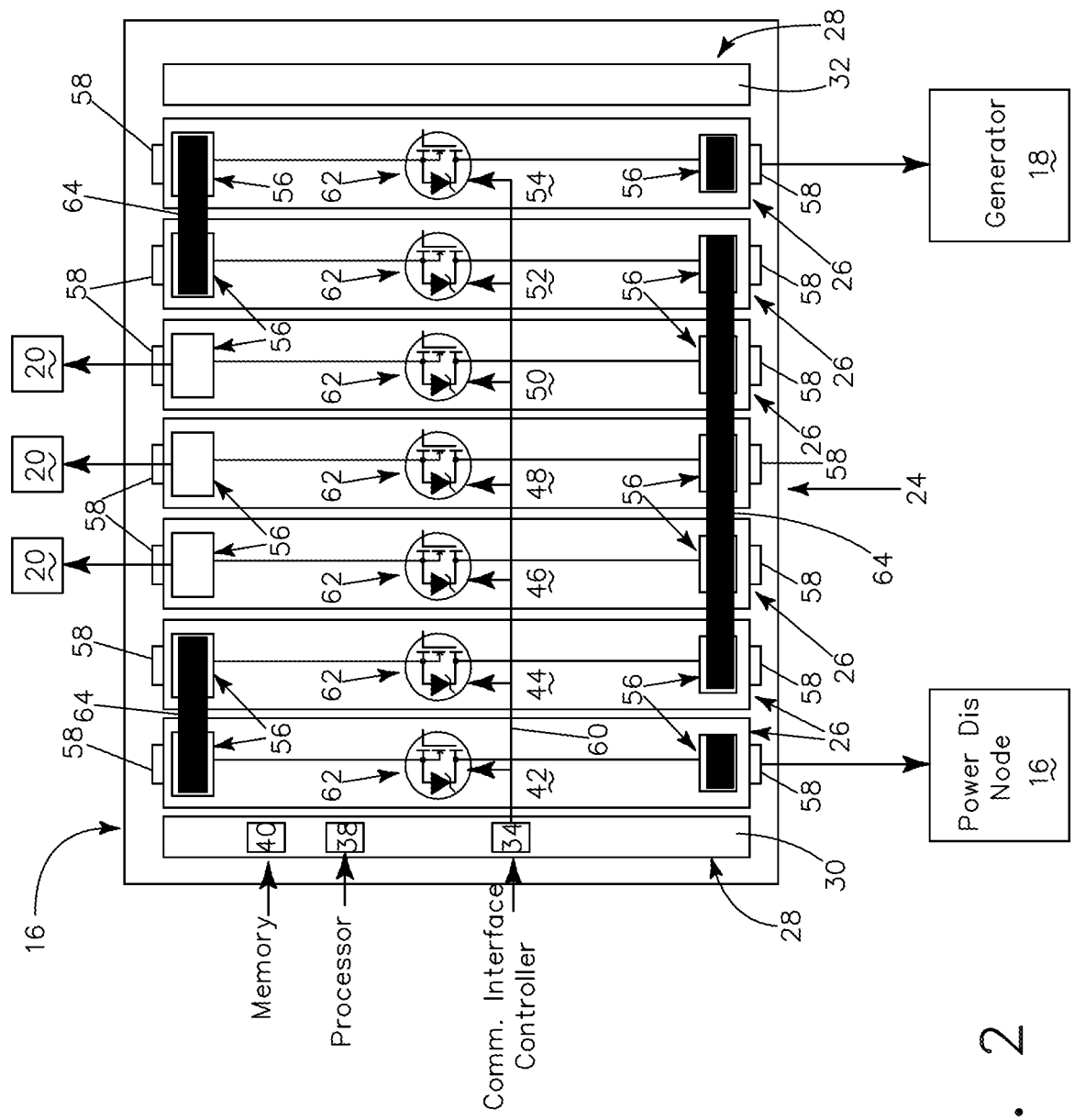
FIG. 2 is a schematic view of a power distribution node of the aircraft and power distribution system of FIG. 1, in accordance with various aspects described herein.

FIG. 2 schematically illustrates a power distribution node 16 of FIG. 1. As shown, the power distribution node 16 can include a modular power distribution apparatus or modular power distribution assembly 24 having a set of switching modules 26 between one or more end modules 28. In the illustrated aspect, the power distribution node 16 includes a first end module 28, shown as a common control module 30, and an opposing second end module 28, which can include an end plate 32 or physical cover. The common control module can further include a set of subcomponents or subsystems including, but not limited to a communication interface controller 34, a processor 38, and memory 40.

In one non-limiting aspect of the power distribution node 16, the set of switching modules 26 can include a first switching module 42, a second switching module 44, a third switching module 46, a fourth switching module 48, a fifth switching module 50, a sixth switching module 52, and a seventh switching module 54. Aspects of the disclosure can be included wherein each in the set of switching modules 26 are substantially alike, that is, of similar construction and composition. Alternatively, the set of switching modules 26 can include at least two subsets of similar constructions and compositions. The similarity of the set of switching modules 26 can enable faster, easier, or more efficient maintenance operations.

The individual switching modules 42, 44, 46, 48, 50, 52, 54 are shown in a common physical alignment, for example, where the longitudinal direction of the set of switching modules 26 is parallel to adjacent switching modules 26, or wherein the set of switching modules 26 is arranged serially, or in series. Each module 42, 44, 46, 48, 50, 52, 54 of the set of switching modules 26 can include at least one switching module electrical power interface 56, at least one input/output connector 58, a switching module communication interface 60, and a switching element 62.

In one non-limiting example, each module 42, 44, 46, 48, 50, 52, 54 can include two electrical power interfaces 56 that are schematically illustrated at opposing longitudinal ends of the module 42, 44, 46, 48, 50, 52, 54. Likewise, in another non-limiting example, each module 42, 44, 46, 48, 50, 52, 54 can include two input/output connectors 58 that are schematically illustrated at opposing longitudinal ends of the module 42, 44, 46, 48, 50, 52, 54. The switching module communication interface 60 of each respective module 42, 44, 46, 48, 50, 52, 54 can collectively define a common control interface 60, which can be further communicatively coupled with the communication interface controller 34 of the common control module 30.

At least a subset of the input/output connectors 58 can be individually electrically coupled with at least one electrical load 20. For example, the third, fourth, and fifth switching modules 46, 48, 50 are each shown having an electrical load 20 coupled with the corresponding switching element 62 via a corresponding input/output connector 58. While only a single input/output connector 58 is coupled with a subset of the switching modules 26, non-limiting aspects of the disclosure can be included wherein a switching module 26 can include a set of input/output connectors 58, or wherein a set of electrical loads 20 are electrically coupled with a single input/output connector 58. Stated another way, a single switching module 26 can include a set of electrically coupled electrical loads 20 and set of input/output connectors 58. Aspects can further be included wherein the switching module 26 can include a switching element 62 corresponding to each input/output connector 58.

Aspects of the switching element 62 can include an electrical switch, such as a solid state power controller, a solid state switch, or a transistor, such as a silicon carbide (SiC) or Gallium Nitride (GaN) based power switch. Additional non-limiting examples of the switching element 62 can include non-polar switching elements 62. Yet additional non-limiting examples of the solid state switch can comprise silicon-based power switches, also capable of high speed switching.

The electrical power interface 56 can be configured to, for example, electrically couple the switching element 62 of the respective module 42, 44, 46, 48, 50, 52, 54 to the at least one input/output connector 58 of the same module 42, 44, 46, 48, 50, 52, 54. Additionally, or alternatively, the electrical power interface 56 can be configured to receive a conductor 64, such as a bus bar connector. The conductor 64 can be selected to enable, for instance, an electrical connection between the electrical power interface 56 of the respective module 42, 44, 46, 48, 50, 52, 54 to at least one electrical power interface 56 of another module 42, 44, 46, 48, 50, 52, 54. For instance, as shown, one conductor 64 electrically connects respective electrical power interfaces 56 between the first and second switching modules 42, 44. Likewise, another conductor 64 electrically connects respective electrical power interfaces 56 between the second, third, fourth, fifth, and sixth switching modules 44, 46, 48, 50, 52. Length of the conductor 64 can be selected based on the desired configuration, that is, the desired electrical coupling of the set of modules 26. Additionally, configurations of the electrical power interfaces 56 or conductors 64 can be selected wherein, for instance, the input/output connector 58 can be electrically coupled with the respective switching element 62 with or without a conductor 64.

While not illustrated, aspects of the switching modules 26 can optionally include additional power electronics components configured, for example, to provide or enable power conversion operations (e.g. AC to DC conversion, DC to AC conversion, a first DC power to a second DC power, etc.) to selectively enable or disable the delivery of power to one or more particular electrical loads 20, depending on, for example, available power distribution supply, criticality of electrical load functionality, or aircraft mode of operation, such as take-off, cruise, or ground operations.

Aspects of the power distribution node 16 or the power distribution assembly 24 can be selectively or electrically coupled to additional power elements of the aircraft 10. For example, the first switching module 42 is shown further electrically coupled with another power distribution node 16, by way of the transmission line received at an input/output connector 58. Also shown, the seventh switching module 54 can be electrical coupled with a generator 18, by way of the transmission line 22 received at an input/output connector 58. While a respective power distribution node 16 and generator 18 are shown, aspects of the disclosure can include an input/output connector 58 electrically coupled with another power distribution node 16, a set of power distribution nodes 16, or at least one power-supplying element, such as the generator 18, auxiliary power generator, emergency power supply, or combination thereof.

If another power distribution node 16 or the generator 18 supplies power to the power distribution node 16 or the power distribution assembly 24, the input/output connector 58 can be operating as an input connector 58 to receive the supplied power. Conversely, if the input/output connector 58 is supplying power to another power distribution node 16 or to the generator 18 (e.g. for starting operations of a starter/generator), then the connector 58 is operating as an output connector 58 to deliver the power. Aspects of the disclosure can include operating the power distribution node 16, the power distribution assembly 24, the switching element 62, or a combination thereof, such that the input/output connector 58 operably switches between receiving input power or supplying output power, for example, to load or to balance current or to provide power redundancies between power sources and electrical loads 20.

The common control module 30 or processor 38 can be configured to control the effective operation of the power distribution node 16 or power distribution assembly 24. In this sense, the common control module 30 or processor 38 can operably control the set of switching modules 26 to selectively enable or disable a supply of power to traverse a first electrical connection (i.e. a first powered or "hot" electrical power interface 56 or input connector 58), to another electrical connection (i.e. the opposing electrical power interface 56 or output connector 58). The common control module 30 or processor 38 operably controls the set of switching modules 26 by selectively operating the respective switching elements 62 by way of the communication interface controller 34 and communication interface 60.

Aspects of the disclosure can be included wherein the processor 38 can include the communication interface controller 34.

The memory 40 of the common control module 30 can store a set of operational control profiles or programs for configuring or operating the power distribution node 16, the power distribution assembly 24, or a combination thereof. The memory 40 can include random access memory (RAM), read-only memory (ROM), flash memory, or one or more different types of portable electronic memory, such as discs, DVDs, CD-ROMs, etc., or any suitable combination of these types of memory. The common control module 30 or processor 38 can be operably coupled with the memory 40 such that one of the common control module 30 and the memory 40 can include all or a portion of a computer program having an executable instruction set for controlling the operation of the aforementioned components, or a method of operating the same. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

Machine-executable instructions, associated data structures, and programs represent examples of program code for executing the exchange of information as disclosed herein. Machine-executable instructions can include, for example, instructions and data, which cause a general purpose computer, a special purpose computer, the common control module 30, or special purpose processing machine to perform a certain function or group of functions. In implementation, the functions can be converted to a computer program comprising a set of executable instructions, which can be executed by the processor 38.

Thus, the common control module 30 or the processor 38 can be configured to effectively control the operation of the set of modules 26 (for instance, by way of the communication interface controller 34 or the communication interface 60) by independently controlling the corresponding set of switching elements 62 of the modules 26. In this sense, the individual switching elements 62 of the set of modules 26 can independently control enabling or disabling a power supply to the coupled electrical load 20.

Figure 3:
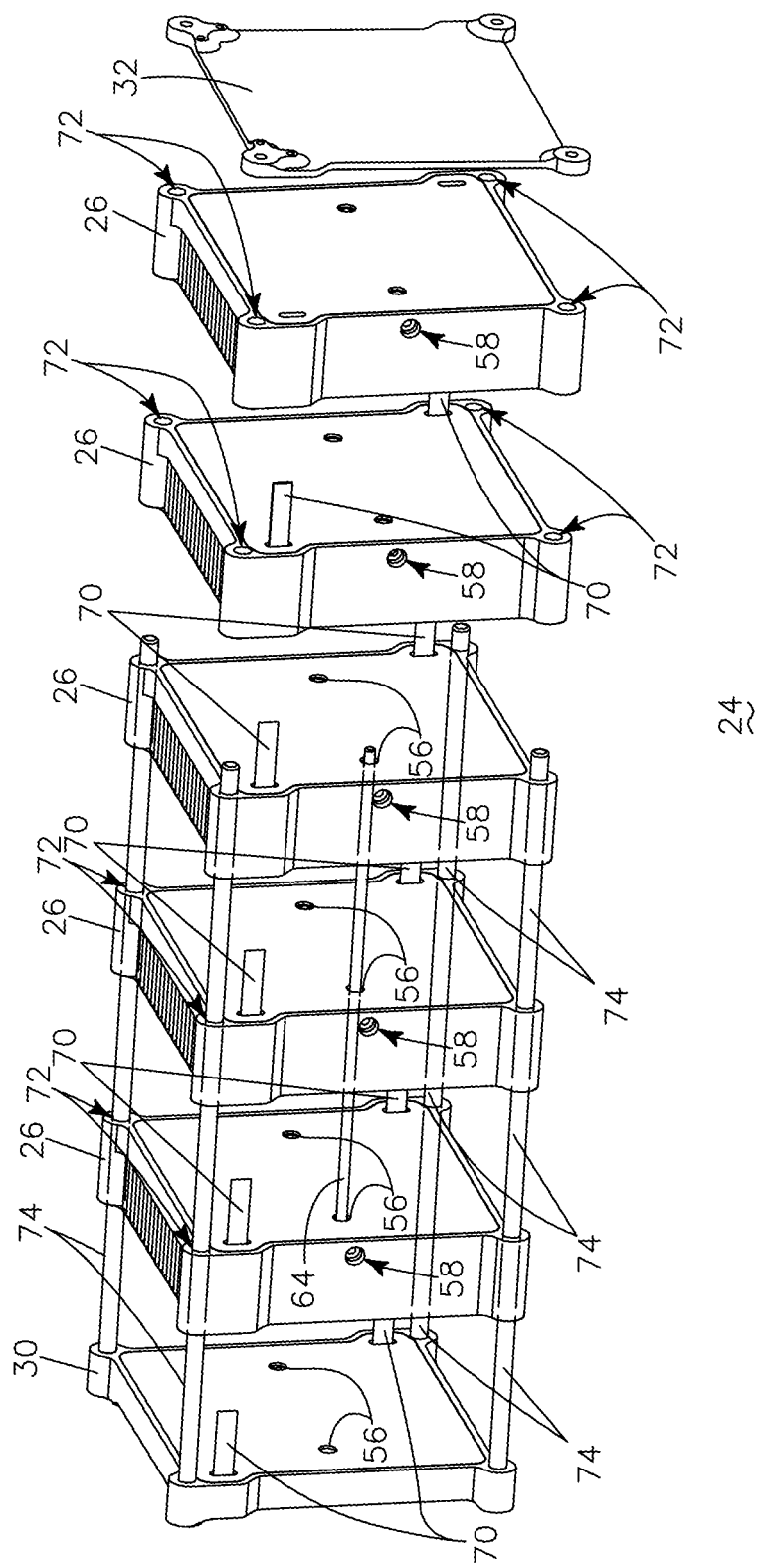
FIG. 3 is an exploded isometric view of a modular power distribution assembly for a power distribution node in accordance with various aspects described herein.

FIG. 3 illustrates a non-limiting isometric view of an aspect of the disclosure wherein the power distribution assembly 24 is exploded to illustrate a portion of the interconnection between the common control module 30 and the set of switching modules 26. As shown, each of the common control module 30 and the set of switching modules 26 can include at least one communicative bus tab 70 that extends normally from the respective module 30, 26 to be received in an corresponding communication bus slot (not shown) in the adjacent module 26. Collectively, the communicative bus tabs 70 operably define the communication interface 60, as explained above. In this sense, each communication bus tab 70 and corresponding communication bus slot can be configured to enable communication with each of the configured modules 26, 30, including transmission and receiving of data packets, data messages, operable instructions, and the like. While the communication interface 60 is shown having independent communicative bus tabs 70, non-limiting aspects of the disclosure can be included wherein the communication interface 60 includes a continuous bus through the power distribution assembly 24.

In one non-limiting example configuration, the modules 26, 30 can include a set of communicative bus tabs 70 (and correspondingly, communicative bus slots) to provide or define a set of communication interfaces 60, to provide redundancy in the communication interface 60, or wherein a first communicative interface 60 provides a different functionality than the second communicative interface 60 (e.g. the first sends data, whereas the second returns data, etc.). Additional non-limiting aspects of the disclosure can be included wherein the communicative bus tabs 70 can be selectively removed where they are unnecessary or not needed to further the communication interface 60 with the next adjacent module or element, such as the end plate 32.

FIG. 3 further illustrates a non-limiting configuration of the conductor 64 that can be configured or selected to extend between a predetermined subset of the modules 26, 30 of the power distribution assembly 24. While two electrical power interfaces 56 are illustrated, any number of electrical power interfaces 56 can be included. Furthermore, it will be understood that the alignment and placement of the electrical power interfaces 56 or conductors 64 can be arranged in alternative positions or configurations, compared with the illustrated example. The set of electrical power interfaces 56 can be similarly located on each of the modules 26, 30, and be sized, shaped, configured, arranged, in registry, or the like, to receive the common conductor 64, or a set of conductors 64. In another non-limiting example, the electrical power interfaces 56, the conductor 64, or a combination there of can be similarly keyed such that the conductor 64 is only received by the set of modules 26, 30 when the modules 26 and conductor 64 are properly oriented and aligned.

The non-limiting illustrated aspect of FIG. 3 additionally illustrates an attachment interface 72, for example a set of attachment points, similarly located on each of the modules 26, 30. As shown, the attachment interface 72 can be size, shaped, configured, in registry, or the like, to receive a common attachment 74, such as a rod configured to physically secure the power distribution assembly 24 together. A single common attachment 74 is illustrated for understanding, but aspects of the disclosure can include a set of common attachments 74, as needed. For example, a set of attachments 74 can be included wherein each individual attachment physically secures a subset of at least two adjacent modules 26, 30 together.

Aspects of the disclosure can further be included wherein the modules 26, 30 are configured in alternative geometric shapes beyond square-like configurations (e.g. circular, triangular, trapezoidal, etc.). In such alternative configurations, the locations of the attachment interface 72 or common attachments 74 can be correspondingly located at corners, one or more axes, or positions relative to the geometric configuration such that the power distribution assembly 24 can be physically secured together, as described herein. Alternative non-limiting aspects of the disclosure can be included wherein the attachment interface 72 and common attachment 74 are configured with mechanical securing mechanisms, such as corresponding screw interfaces, to enable securing of the power distribution assembly 24. Alternative securing mechanisms can be included. For example, at least one of the attachment interface 72 or the common attachment 74 can include a locating pin for physically securing purposes or alignment purposes, or a seal between adjacent modules 26, 30.

Figure 4:
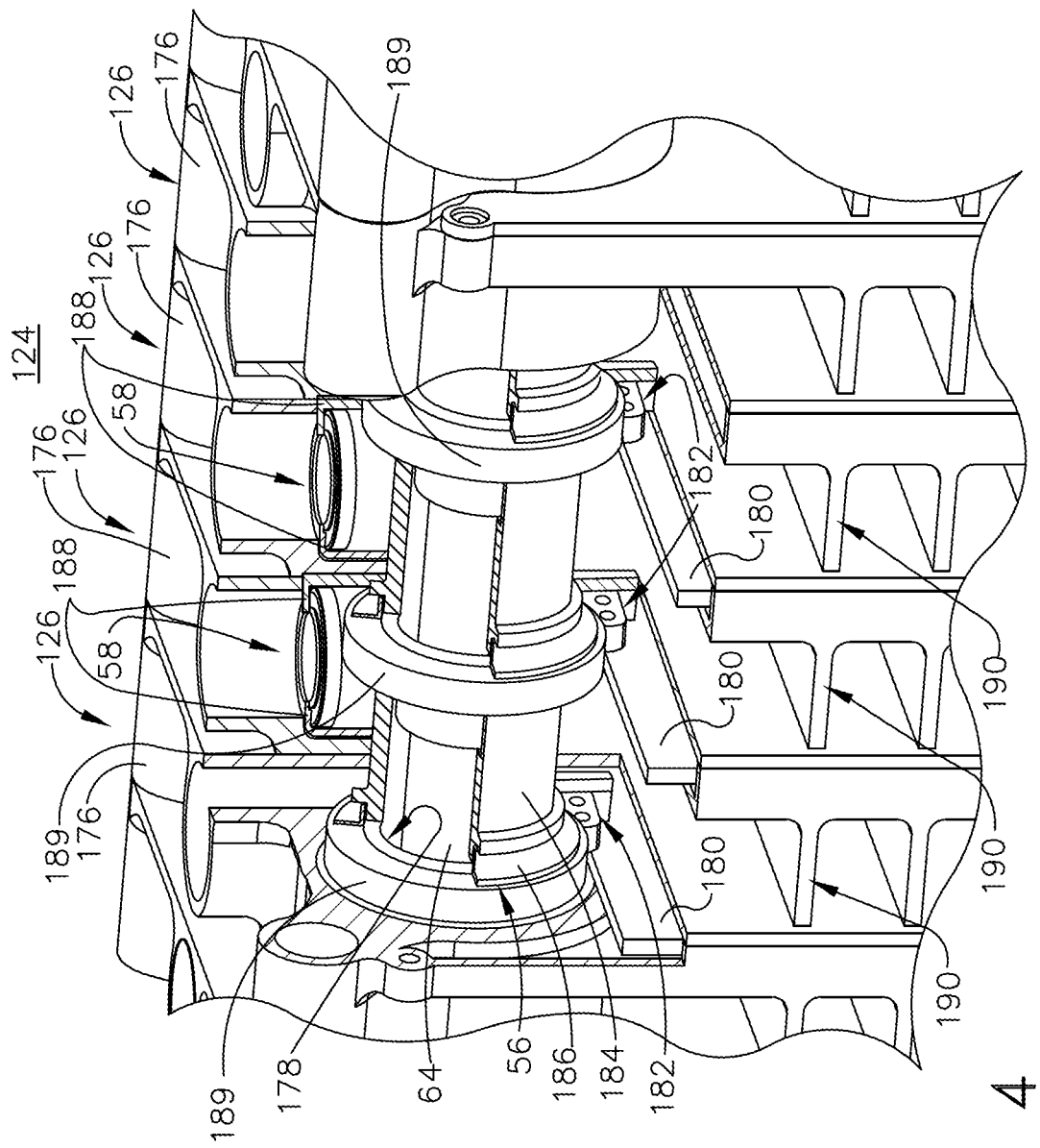
FIG. 4 is a schematic cut-away view of the assembled power distribution assembly of FIG. 3, in accordance with various aspects described herein.

FIG. 4 illustrates a schematic cut-away view of the assembled power distribution assembly 124 of FIG. 3. The assembled power distribution assembly 124 is similar to the power distribution assembly 24; therefore, like parts will be identified with like numerals increased by 100, with it being understood that the description of the like parts of the power distribution assembly 24 applies to the assembled power distribution assembly 124, unless otherwise noted. One difference is that the schematic view of FIG. 4 illustrates the electrical power interface 56 and conductor 64 closer to an edge or side of the assembled power distribution assembly 124, for ease of understanding and explanation. As shown, the switching modules 126 can include respective housings 176 that are cut away to illustrate the electrical power interface 56, input/output connectors 58, and a power electronics substrate, such as a printed circuit board (PCB) 180. Non-limiting aspects of the disclosure can be included wherein the power electrics substrate, PCB 180, or the like can support or include the respective switching element 62 described herein. Further non-limiting aspects of the disclosure can be included wherein the PCB 180 includes any other power electronics utilized to operate, as described herein.

In non-limiting example, the input/output connectors 58 can be electrically isolated from the respective housing 176 by way of an electrical insulator 188.

The electrical power interface 56 of the respective switching modules 126 can include an aperture 178 defining an opening of the switching module 126, the housing 176, or the like, extending therethrough. Collectively, the set of apertures 178 of the set of switching modules 126 define a continuous alignment adapted or configured to receive a continuous or straight conductor 64, such as a power bus bar, therethrough, for the power distribution assembly 124. Non-limiting aspects of the electrical power interface 56 can include at least one electrically insulating element, shown as a first insulating element 184 and a second insulating element 186. Besides electrically insulating the conductor 64 from the set of housings 176 of the set of switching modules 126, non-limiting aspects of the insulating elements 184, 186 can include or be configured to provide for axial spacing or maintaining axial spacing between adjacent switching modules 126, housings 176, or the like. In another non-limiting example, the arrangement of the set of insulating elements 184, 186 can be adapted for or allow for alignment of the conductor 64 when the conductor 64 is received by the electrical power interface 56 or through the set of apertures 178. In the non-limiting examples wherein at least one of the apertures 178, electrical power interfaces 56, or conductors 64 are keyed for an oriented receiving, at least one of the insulating elements 184, 186 can also be optionally keyed.

Each of the set of modules 126 can further include a conductive connecter adapted for connecting with the conductor 64, such as a sprung connector 189, a louver connector, or any through connector having contacts to maintain electrical contact with the conductor 64. As shown, one such conductive connector in the form of a sprung connector 189 can be configured or adapted to receive the conductor 64 through a center opening, while making conductive contact with the conductor 64. In one non-limiting example, the conductive connector can be annular about the conductor 64. The conductive connector can further be electrically connected with the PCB 180 or power switch by way of a contact point 182.

In another non-limiting example, the set of power modules 126 can include a respective set of heat dissipation elements or heatsinks 190, illustrated as fins, for active or passive cooling of the power switches or PCBs 180. Further non-limiting examples of the heat dissipation elements can include thermal fins, heat pipes, or the like. The heat dissipation elements can be configured to enable cooling air or coolant to pass across the heat dissipation elements 86 as needed to enable a desired cooling process, a desired cooling profile, or desired operating conditions.

As shown, non-limiting aspects of the disclosure can be included wherein the conductor 64 is a generally cylindrical bar having a circular cross section, wherein the conductor 64 is received by the electrical power interface 56 normally to a major longitudinal plane of at least one of the set of modules 126. In this example, the set of modules 126 can be aligned in parallel such that the conductor 64 is received normally to the set of modules 126. At least a subset of the insulators 184, 186, electrical power interfaces 56, apertures 178, or the like can further correspond with the geometric cross-sectional shape or contours of the conductor 64 such that the conductor can be received therethrough. While a substantially circular cross section of the conductor 64 is described and illustrated herein, non-limiting aspects of the conductor 64, and correspondingly, the insulators 184, 186, electrical power interfaces 56, apertures 178, or the like, can have alternative geometric cross sections, contours, shapes, or the like.

Figure 5:
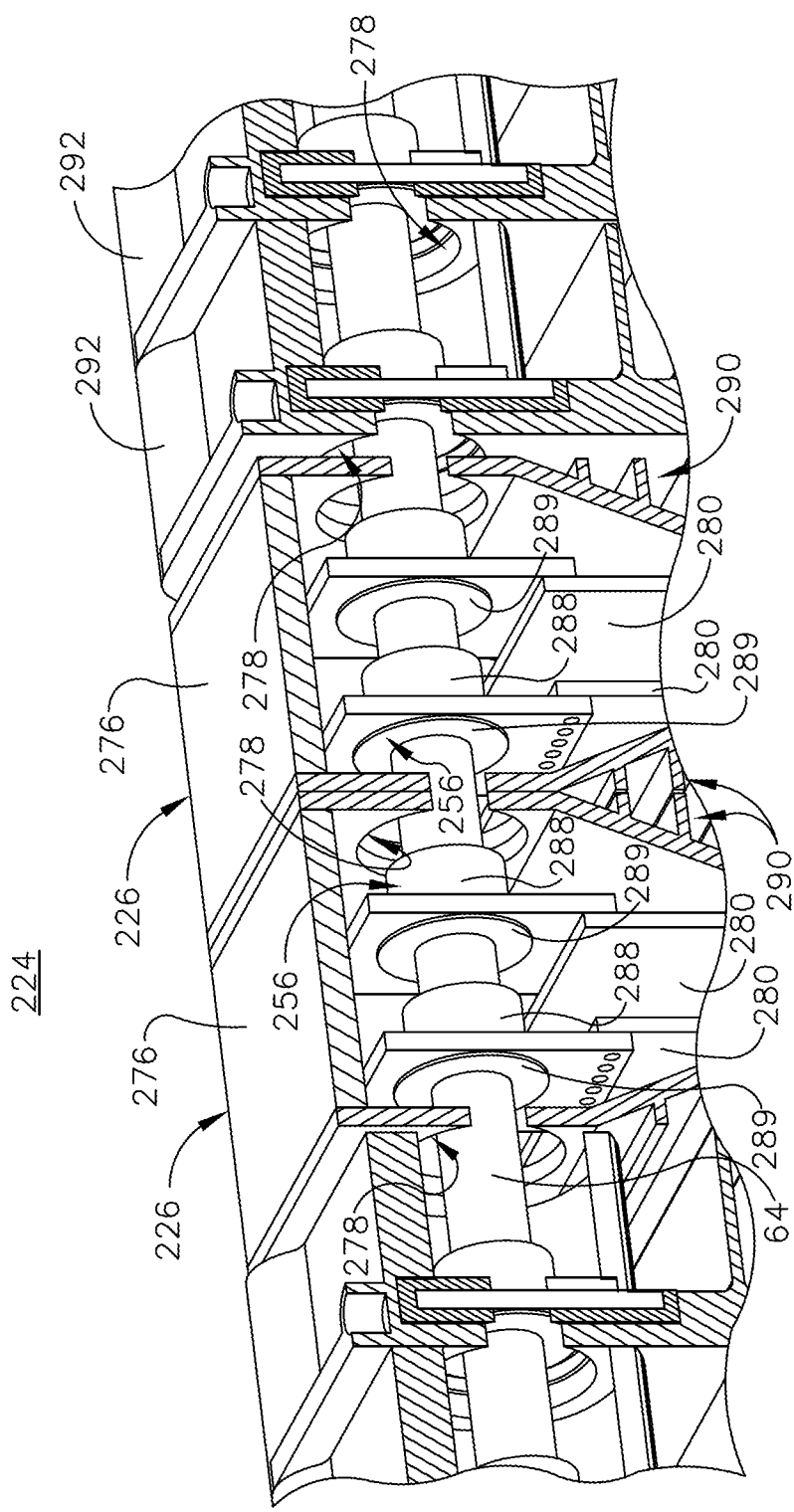
FIG. 5 is a cross-sectional view of the assembled power distribution assembly of FIG. 4, in accordance with various aspects described herein.

FIG. 5 illustrates a schematic cross-sectional view of an assembled power distribution assembly 224 in accordance with another aspect of the disclosure. The assembled power distribution assembly 224 is similar to the power distribution assembly 24, 124; therefore, like parts will be identified with like numerals increased by 200, with it being understood that the description of the like parts of the power distribution assembly 24, 124 applies to the assembled power distribution assembly 224, unless otherwise noted. One difference is that the assembled power distribution assembly 224 includes a set of switching modules 226, 292 having different forms, but similar electrical power interface 256 connections, compared with the aforementioned set of switching modules 126.

As shown, at least subset of the switching modules 226, 292 or module housings 276 can include a set of power electronics substrates, such as PCBs 280, and shown as two PCBs 280. Another difference is that the heatsinks 290 can vary between the sets of power modules 226, 292. The assembled power distribution assembly 224 can include a respective set of apertures 278, electrical insulators 288, and conductive connecters adapted for connecting with the conductor 64, such as a sprung connector 289 or louver connector, which can operate substantially similar to the earlier-described aspects of the disclosure. In non-limiting examples of the disclosure, the electrical insulators can include or be configured to provide for axial spacing or maintaining axial spacing between adjacent switching modules 226, 292, housings 276, PCBs 280, or the like.

Many other possible aspects and configurations in addition to that shown in the above figures are contemplated by the present disclosure. For example, one aspect of the disclosure contemplates a configuration wherein both end modules 28 can include common control modules 30 to enable, for example, redundancy in controlling the switching modules. Additionally, any number of switching modules 26 can be included in a power distribution node 16 or a power distribution assembly 24, and can be arranged or assembled based on like power distribution requirements such as AC or DC power, like power outputs such as voltage levels, electrical load 20 criticality, load or current balancing such as current draw, or the like. In another example configuration, a set or subset of the switching modules can be electrically arranged in parallel to perform additional or alternative power distribution or switching operations. In yet another configuration, the input/output connectors 58 can be selectively enabled or configured to only operate in one of input or output mode. In another non-limiting aspect, one or more voltage converter modules can be directly connected with an electrical output or electrical load 20. Similarly, in another non-limiting aspect, one or more voltage converter modules can be directly connected with a power input, such as a generator 18.

In yet another configuration, the physical configuration of the set of modules 26, 30 can be keyed or arranged such that the power distribution assembly 24 can only be correctly coupled, assembled, or operated in a single known arrangement to prevent incorrect assembly or operation. For example, at least one of the common attachment 74, the communicative bus tabs 70, or electrical power interfaces 56 can be keyed or arranged to provide a known assembly orientation. In yet another configuration, the above-described configuration of the two switching modules 26 providing the bi-directional or bi-polar switch can be substituted with a single switching module 26 configured to provide bi-directional or bi-polar switching between the power distribution node 16 or power distribution assembly 24 and the greater power distribution network. In yet another aspect of the disclosure, the common control module 30 of a first power distribution assembly 24 can be communicatively coupled with at least one other common control module 30 of at least another power distribution assembly 24 such that the power distribution network can share control, awareness, statuses, or errors across the network.

The aspects disclosed herein provide a method and assembly for distributing power in a power distribution network by assembling a modular and scalable power distribution and conversion assembly. The technical effect of the above-described aspects is that a modular power distribution node or assembly can be designed, as needed or on-demand, to operate power switching functions to electrical loads, or power converting and further switching functions, as described herein. One advantage that can be realized in the above aspects is that the tailoring to the particularized power distribution needs can reduce the number of unnecessary components included in the distribution node. In another aspect, the use of pass-through power connectors can be utilized between the set of power modules to facilitate a common connection of multiple adjacent modules with bussing of uniform conductor sections.

In another aspect, the above described aspects can reduce the use of mechanical joints (e.g. bolts, screws and the like) in connecting the bussing from the power source to the set of modules. The reduction of mechanical joints, in turn, increases reliability by reducing mechanical components that can wear out over time. By eliminating mechanical components, additional space and weight savings can be achieved.

Furthermore, the power distribution assembly itself can be selected to only provide a limited number of power outputs, including dissimilar power output characteristics (via a power converter module) tailored to the expected number of electrical loads required for particular node operations. Thus, aspects of the disclosure enable an optimized component size and power conversion operations per node installation. By reducing the number of components and reducing the total installation node volume, the above-described aspects of the disclosure have superior weight and size advantages over the conventional power distribution systems.

Another advantage to the above-described aspects is that by reducing the number of unnecessary components can reduce the cost for the power distribution assembly or node. Moreover, a decreased number of parts as the system will make the distribution system, power distribution assembly, or node inherently more reliable. Yet another advantage to the above-described aspects is that the smaller installation volume of the power distribution assembly can allow for the installation of the assembly closer to the electrical loads being serviced by the node. This closer proximity results in a reduction of interconnecting transmission wire lengths with the assembly output, and hence a corresponding weight reduction due to wiring. The power converting functionality can further allow for installation of the assembly closer to the electrical loads without having to include external power converting assembly. The power converting functionality can further be tailored by utilizing smaller converters in the system, to minimize over-supply at a disposed location, while allowing minimal cooling due to smaller power conversion. Furthermore, by utilizing smaller converters, redundancies in power conversion can be included with less disruption, volume required, or heat requirements.

Yet additional advantages can include minimized wire weight due to proximity of the power distribution node to the electrical loads, greater flexibility in design and utilization of power electronics, modular construction, and reusable modules resulting in reduced engineering, development, testing, and validation efforts and costs. Additionally, by reducing the number of electrical interfaces to electrically connect the power bus to the power distribution nodes or PCBs, the amount of thermal losses is further reduced. The proximity of the power bus to the PCBs, and the reduced bus length further reduces thermal losses.

When designing aircraft components, important factors to address are size, weight, and reliability. The above described power distribution assembly results in a lower weight, smaller sized, increased performance, and increased reliability system. The lower number of parts and reduced maintenance will lead to a lower product costs and lower operating costs. Reduced weight and size correlate to competitive advantages during flight.

To the extent not already described, the different features and structures of the various aspects may be used in combination with each other as desired. That one feature may not be illustrated in all of the aspects is not meant to be construed that it may not be, but is done for brevity of description. Thus, the various features of the different aspects may be mixed and matched as desired to form new aspects, whether or not the new aspects are expressly described. All combinations or permutations of features described herein are covered by this disclosure.

This written description uses examples to disclose aspects of the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A modular power distribution assembly comprising:
a first power module having a power input, a first aperture extending therethrough, and a first bus bar connector at the first aperture; and
a set of second power modules, each of the second power modules having a power switch, a second aperture extending therethrough, and a second bus bar connector at the second aperture;
wherein the first power module and the set of second power modules have a set of attachment interfaces adapted to physically secure the first power module to the set of second power modules, and wherein the physically securing of the first power module to the set of second power modules aligns the first aperture with each of the second aperture to receive a continuous bus bar therethrough.

2. The modular power distribution assembly of claim 1 wherein the first power module and the set of second power modules include the set of attachment interfaces in registry.

3. The modular power distribution assembly of claim 2 wherein the first power module and the set of second power modules are mechanically connectable via the set of attachment interfaces.

4. The modular power distribution assembly of claim 1 wherein the first aperture and each of the second aperture are in registry.

5. The modular power distribution assembly of claim 4 further comprising a set of non-conductive insulators in registry with the first aperture and each of the second aperture.

6. The modular power distribution assembly of claim 5 wherein the set of non-conductive insulators are sized to maintain axial spacing, relative to the first aperture and each of the second aperture, between at least one of:
the first aperture and each of the second aperture, or
the first bus bar connector and each of the second bus bar connector.

7. The modular power distribution assembly of claim 1 further comprising the continuous bus bar received through the first aperture and each of the second aperture and connected with the first bus bar connector and each of the second bus bar connector.

8. The modular power distribution assembly of claim 1 wherein at least one of the first bus bar connector or one or more of the second bus bar connector is a sprung connector.

9. The modular power distribution assembly of claim 1 further comprising the continuous bus bar received axially through the first aperture and each of the second aperture and conductively connected with the first bus bar connector and each of the second bus bar connector, wherein the continuous bus bar connects the power input to each of the power switch of the set of second power modules.

10. The modular power distribution assembly of claim 9 wherein the continuous bus bar is keyed relative to at least one of the first power module or the second power modules.

11. The modular power distribution assembly of claim 10 wherein the keyed continuous bus bar is only receivable when oriented in registry with at least one of a correspondingly keyed one of the first aperture, a correspondingly keyed one of the second aperture, a correspondingly keyed one of the first bus bar connector, or a correspondingly keyed one of the second bus bar connector.

12. The modular power distribution assembly of claim 9 wherein the continuous bus bar has a circular cross section.

13. A modular power distribution apparatus comprising:
a first end module and a second end module, at least one of the first end module or second end module having at least one of an end module communication interface or a processor; and
at least one switching module, each of the at least one switching module having a switching module electrical power interface, a bus bar connector, a switching element, an input/output connector, and a switching module communication interface, wherein each of the switching module electrical power interface is configured to electrically connect to another one of the at least one switching module by way of the bus bar connector;
wherein the bus bar connector includes an aperture extending through each of the at least one switching module and a sprung connector connected with the switching element, the aperture and the sprung connector adapted to receive a bus bar.

14. The modular power distribution apparatus of claim 13 wherein the first end module, the second end module, and the at least one switching module include a set of attachment interfaces in registry.

15. The modular power distribution apparatus of claim 14 wherein the first end module, the second end module, and the at least one switching module are mechanically connectable via the set of attachment interfaces.

16. The modular power distribution apparatus of claim 15 further comprising a set of non-conductive insulators in registry with each of the aperture of the at least one switching module.

17. The modular power distribution apparatus of claim 13 wherein the at least one switching module comprises at least two switching modules and the bus bar received axially through the aperture of the at least two switching module and conductively connected with the sprung connector of the at least two switching module.

18. The modular power distribution apparatus of claim 17 wherein the bus bar is keyed relative to at least one of the at least two switching modules.

19. The modular power distribution apparatus of claim 18 wherein the keyed bus bar is only receivable when oriented in registry with:
at least one of a correspondingly keyed one of the aperture of the at least one of the at least two switching modules, or
at least one of a correspondingly keyed one of the sprung connector of the at least one of the at least two switching modules.

20. The modular power distribution apparatus of claim 17 wherein the bus bar has a circular cross section.

* * * * *